(12) United States Patent
Mazumder et al.

(10) Patent No.: US 11,232,830 B1
(45) Date of Patent: Jan. 25, 2022

(54) AUTO-PRECHARGE FOR A MEMORY BANK STACK

(71) Applicant: Micron Technology, Inc., Boise, ID (US)

(72) Inventors: Kallol Mazumder, Dallas, TX (US); Harish V. Gadamsetty, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/119,226

(22) Filed: Dec. 11, 2020

(51) Int. Cl.
*G11C 7/00* (2006.01)
*G11C 11/4091* (2006.01)
*G11C 8/18* (2006.01)
*G11C 11/4076* (2006.01)
*G11C 11/4093* (2006.01)

(52) U.S. Cl.
CPC .......... *G11C 11/4091* (2013.01); *G11C 8/18* (2013.01); *G11C 11/4076* (2013.01); *G11C 11/4093* (2013.01)

(58) Field of Classification Search
CPC ................................ G11C 11/4091
USPC .......................................... 365/203
See application file for complete search history.

(56) References Cited

U.S. PATENT DOCUMENTS

2008/0205175 A1* 8/2008 Park ............ G11C 7/1072
365/203
2020/0303030 A1* 9/2020 Lee ............ G11C 7/1051

* cited by examiner

*Primary Examiner* — Hoai V Ho
(74) *Attorney, Agent, or Firm* — Fletcher Yoder, P.C.

(57) ABSTRACT

Devices and methods include a command interface configured to receive commands, such as a write with an automatic precharge. A bank-specific decoder decodes the write with an automatic precharge command for a corresponding memory bank and outputs a write auto-precharge (WrAP) signal. This WrAP signal has not been adjusted for a write recovery time for the memory bank. Accordingly, bank processing circuitry in a bank receiving the WrAP signal uses the WrAP to cause its internal lockout circuitry to apply a tWR lockout based at least in part on a mode register setting and on the WrAP signal indicating receipt of the write with an automatic precharge command.

21 Claims, 8 Drawing Sheets

AUTO-PRECHARGE FOR A MEMORY BANK STACK

BACKGROUND

Field of the Present Disclosure

Embodiments of the present disclosure relate generally to the field of memory devices. More specifically, embodiments of the present disclosure relate to auto-precharge processes (e.g., write with auto-precharge (Wr-AutoP)) for memory banks.

Description of Related Art

Various operations in a memory device may rely on clocks between die (e.g., memory banks) in the memory device. For instance, the clock may be received from an external device, such as a host device (e.g., processor). For example, in memory devices utilizing a double-data rate version 5 (DDR5) of a dynamic random accessible memory (DRAM) may use an inter-die clock to handle Wr-AutoP processes. With speeds in memory devices increasing and the prevalence of different connection techniques (e.g., wire bonding), clock delivery may cause issues with transmitting the high-speed signals between die. To accommodate, a drive strength of the high-speed signals may be increased to accommodate the higher frequency signals on the different connection techniques due to the parasitics of the different connection techniques.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

An activate command may precede a corresponding operation, such as a precharge operation. Some precharge operations may be specialized for a type of operation (e.g., a write operation with an auto-precharge). For example, a write auto-precharge operation may enable fast, automatic precharges after a write operation. However, the auto-precharge operation for a write operation may have different timing than other precharge operations. For instance, a write auto-precharge (Wr-AutoP) may use additional timing lock-outs/delays for a time of write recovery (tWR) for the memory bank. This additional period of lockout may be implemented using a shifter and a FIFO to implement the additional delays for Wr-AutoP. However, these circuitries may be implemented using clock shifters utilizing a clock (e.g., ClkG) that may increase costs in area and power consumption. To eliminate the additional clock and clock limiting circuitries, a Wr-AutoP signal may be sent to the banks to enable the banks to reuse tRAS lockouts for tWR lockouts to utilize the correct timing for the Wr-AutoP operation.

Figure 1:
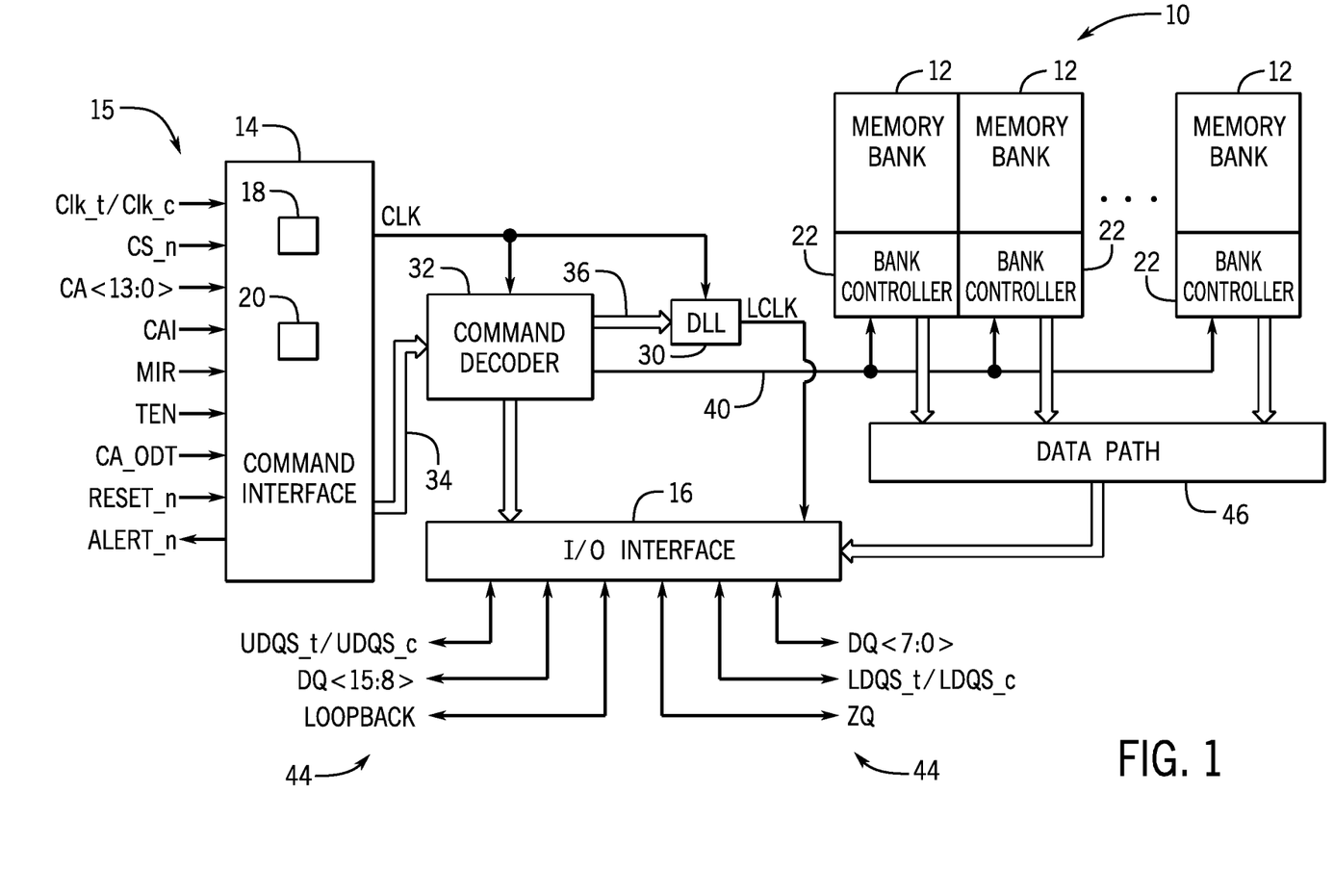
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system. In some embodiments of the memory device 10, the memory banks 12 may be stacked in a vertical arrangement. For instance, a Rank0 bank may be coupled to a printed circuit board or controller die with Rank1-N (e.g., 1, 2, 3, 4) banks being stacked on top of the Rank0 bank. In some embodiments, the Rank0 bank may act as a "master" for the other ranks of memory banks 12.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the bar clock signal (Clk_b). The positive clock edge for DDR refers to the point where the rising true clock signal Clk_t crosses the falling bar clock signal Clk_b, while the negative clock edge indicates that transition of the falling true clock signal Clk_t and the rising of the bar clock signal Clk_b. Commands (e.g., read command, write command, etc.) are typically entered on the positive edges of the clock signal and data is transmitted or received on both the positive and negative clock edges.

The clock input circuit 18 receives the true clock signal (Clk_t) and the bar clock signal (Clk_b) and generates an internal clock signal CLK. The internal clock signal CLK is supplied to an internal clock generator, such as a delay locked loop (DLL) circuit 30. The DLL circuit 30 generates an internal clock signal LCLK based on the received internal clock signal CLK. The internal clock signal LCLK is supplied to the I/O interface 16, for instance, and is used as a timing signal for determining an output timing of read data. The clock input circuit 18 may also include gating circuitry that is configured to gate the propagation of the received clock to the internal clock to prevent moving voltages of capacitors in the memory device 10 and consuming power. Thus, unless the internal clock is to be used, the clock input circuit 18 may utilize clock gating to block propagation of the internal clock.

The internal clock signal(s) CLK, when propagated, may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the internal clock signal LCLK. The internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_b). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the data path 46, which includes a plurality of bi-directional data buses. Data TO signals, generally referred to as DQ signals, are generally transmitted and received in one or more bi-directional data busses. For certain memory devices, such as a DDR5 SDRAM memory device, the TO signals may be divided into upper and lower bytes. For instance, for a x16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_b), the DQS signals may be provided as a differential pair of data strobe signals (DQS_t and DQS_b) to provide differential pair signaling during reads and writes. For certain memory devices, such as a DDR5 SDRAM memory device, the differential pairs of DQS signals may be divided into upper and lower data strobe signals (e.g., UDQS_t and UDQS_b; LDQS_t and LDQS_b) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
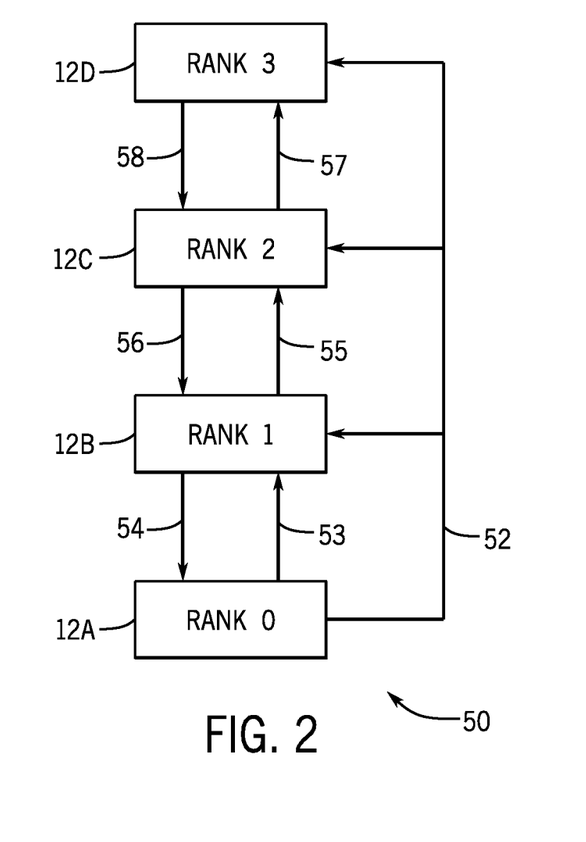
FIG. 2 is a block diagram view of a stack of memory banks in the memory device of FIG. 1, according to an embodiment of the present disclosure.

FIG. 2 is a block diagram of a stack 50 of memory banks 12, individually referred to as Rank0 bank 12A, Rank1 bank 12B, Rank2 bank 12C, and Rank3 bank 12D. Each bank may include/utilize one or more die. Although the illustrated embodiment includes four memory banks 12, other embodiments of the memory device 10 may include a different number of memory banks 12, such as 2, 4, 8, or more banks. Since a Wr-AutoP command may occur independently on each die in the stack 50, a ClkG 52 may be sent from the Rank0 bank 12A to each of the other banks (e.g., Rank1 bank 12B, Rank2 bank 12C, and Rank3 bank 12D) to aid the memory banks 12 in performing Wr-AutoP operations. In other words, the ClkG 52 is used by the banks 12 to perform the Wr-AutoP operation. However, the generation and transmission of the ClkG 52 may be complicated due to Wr-AutoP burst information being received at a memory bank 12 (e.g., Rank1 bank 12B) with return information being transmitted back from the memory bank 12 to the corresponding Rank0 bank 12A. For instance, a Wr-AutoP command received at the bank control 22 targeting Rank1 bank 12B is transmitted to Rank1 bank 12B from Rank0 bank 12A via path 53 with return information transmitted back to Rank0 bank 12A from Rank1 bank 12B via path 54. Similarly, a Wr-AutoP command received at the bank control 22 (e.g., from a host device via the command interface 14) targeting Rank2 bank 12C is transmitted to Rank2 bank 12C from Rank0 bank 12A via path 55 with return information transmitted back to Rank0 bank 12A from Rank2 bank 12C via path 56. Likewise, a Wr-AutoP command received at the bank control 22 targeting Rank3 bank 12D is transmitted to Rank3 bank 12D from Rank0 bank 12A via path 57 with return information transmitted back to Rank0 bank 12A from Rank3 bank 12D via path 58. Regardless of which memory bank 12 is targeted, the Rank0 bank 12A may decode and add a chip-ID qualification that then may be decoded by the respective bank 12. However, each of the memory banks 12 may receive and internalize the ClkG 52 even when the memory banks are not targeted for the Wr-AutoP operation.

In some embodiments, communications between the Rank2 bank 12C and the Rank0 bank 12A may be transmitted through the Rank1 bank 12B with communications to the Rank 2 bank 12C being transmitted via paths 53 and 55 and return communications being transmitted via paths 54 and 56. Alternatively, communications via the paths 55 and 56 may bypass the Rank1 bank 12B.

Likewise, in some embodiments, communications between the Rank3 bank 12D and the Rank0 bank 12A may be transmitted through the Rank1 bank 12B and/or Rank2 bank 12C with communications to the Rank 3 bank 12D being transmitted via paths 57 and 53 and/or 55 and return communications being transmitted via paths 58 and 54 and/or 56. Alternatively, communications via the paths 58 and 57 may bypass the Rank1 bank 12B and/or the Rank2 bank 12C.

Regardless of the foregoing implementations used, each transmission includes at least two-way travel of communications for a Wr-AutoP operation. Furthermore, with some implementations (e.g., Wire-Bond 3D implementations) at high speeds, the drive strength of the clock is relatively high. Accordingly, the clock that travels from the Rank0 bank 12A to the other memory banks 12 may consume a relatively high amount of power. The signal path consists of a transmitter located in a region (e.g., center region) of the Rank0 bank 12A and a target receiver in the targeted memory bank 12. This receiver may be located in a center region within the die. For the ClkG 52 to reach the receiver of the targeted bank 12, the ClkG 52 may pass through an edge of the memory bank 12 without chip-ID qualification at an edge receiver of the bank 12. Accordingly, the transmission of the ClkG 52 to the receiver in the center region may cause the ClkG 52 to be transmitted through at least some portion of each of the banks 12 increasing the power consumption of the generation and transmission of the ClkG 52.

Figure 3:
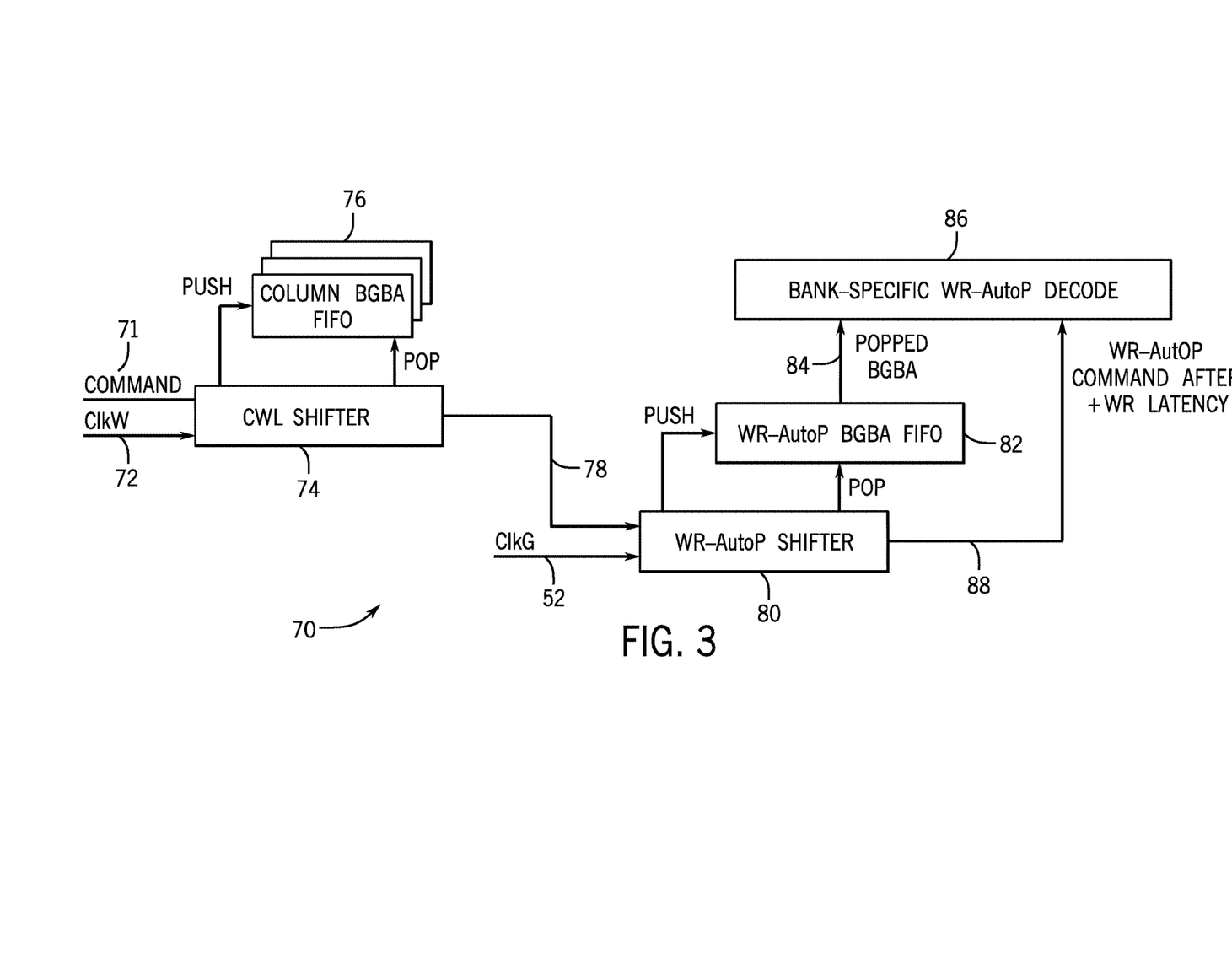
FIG. 3 is a block diagram of a write auto-precharge (Wr-AutoP) using a dedicated pre-charge clock propagation between the memory banks of FIG. 2, according to an embodiment of the present disclosure.

FIG. 3 is a block diagram of a Wr-AutoP process 70 that may be performed in the memory device 10. A command 71 and a clock ClkW 72 are received at a column-address strobe (cas) write latency (CWL) shifter 74. The command 71 (e.g., a Wr-AutoP command) is received from a host device at the command interface 14. The ClkW 72 may be the same as or generated from the Clk_t/Clk_c in FIG. 1. The CWL shifter 74 may be located in the command interface 14, the command decoder 32, the bus path 40, or the data path 46. The CWL shifter 74 contains a number of shifters (e.g., flip-flops/latches) that shifts the command 71 using the ClkW 72. The amount of shift may be equal to or greater than the CWL. For instance, the shift may include the CWL plus a number of cycles equal to a burst length divided by two for double data rate. When a column address corresponding to the command is received, the CWL shifter 74 pushes the column address onto a column address bank group and bank address (BGBA) FIFO 76. When the command has passed through the CWL shifter 74, the CWL shifter 74 pops the column address from the BGBA FIFO 76. In some embodiments, the column address that is popped from the BGBA FIFO 76 is directed to a location (e.g., a Wr-AutoP-specific FIFO/shifter) based on the type of command that was received.

A shifted command 78 is transmitted from the CWL shifter 74 to a Wr-AutoP shifter 80 that receives the clock ClkG 52. The Wr-AutoP shifter 80 includes a number of shifters (e.g., flip-flops/latches) that shifts the shifted command 78 by the write recovery time (tWR). The tWR may be set using a mode register for the memory device 10 that sets the number of cycles. For example, the mode register may include a number of bits (e.g., 4) that may be used to select the number of clock cycles to be delayed for tWR to allow sufficient recovery time after a write. For example, the tWR may be specified as 48, 54, 60, 66, 72, 78, 84, 90, 96, or any other number of clock cycles as the tWR to set a specific duration (e.g., 30 ns).

When the shifted command 78 enters the Wr-AutoP shifter 80, a push is made onto a Wr-AutoP BGBA FIFO 82. For instance, the bank address may be pushed from the BGBA FIFO 76. When the shifted command 78 completes shifting through the Wr-AutoP shifter 80, a popped bank address 84 is popped from a top of the stack of a respective Wr-AutoP BGBA FIFO 82. The popped bank address 84 is then transmitted to a bank-specific Wr-AutoP Decode 86 that is used to decode a tWR-shifted command 88 that corresponds to the popped bank address 84.

Figure 4:
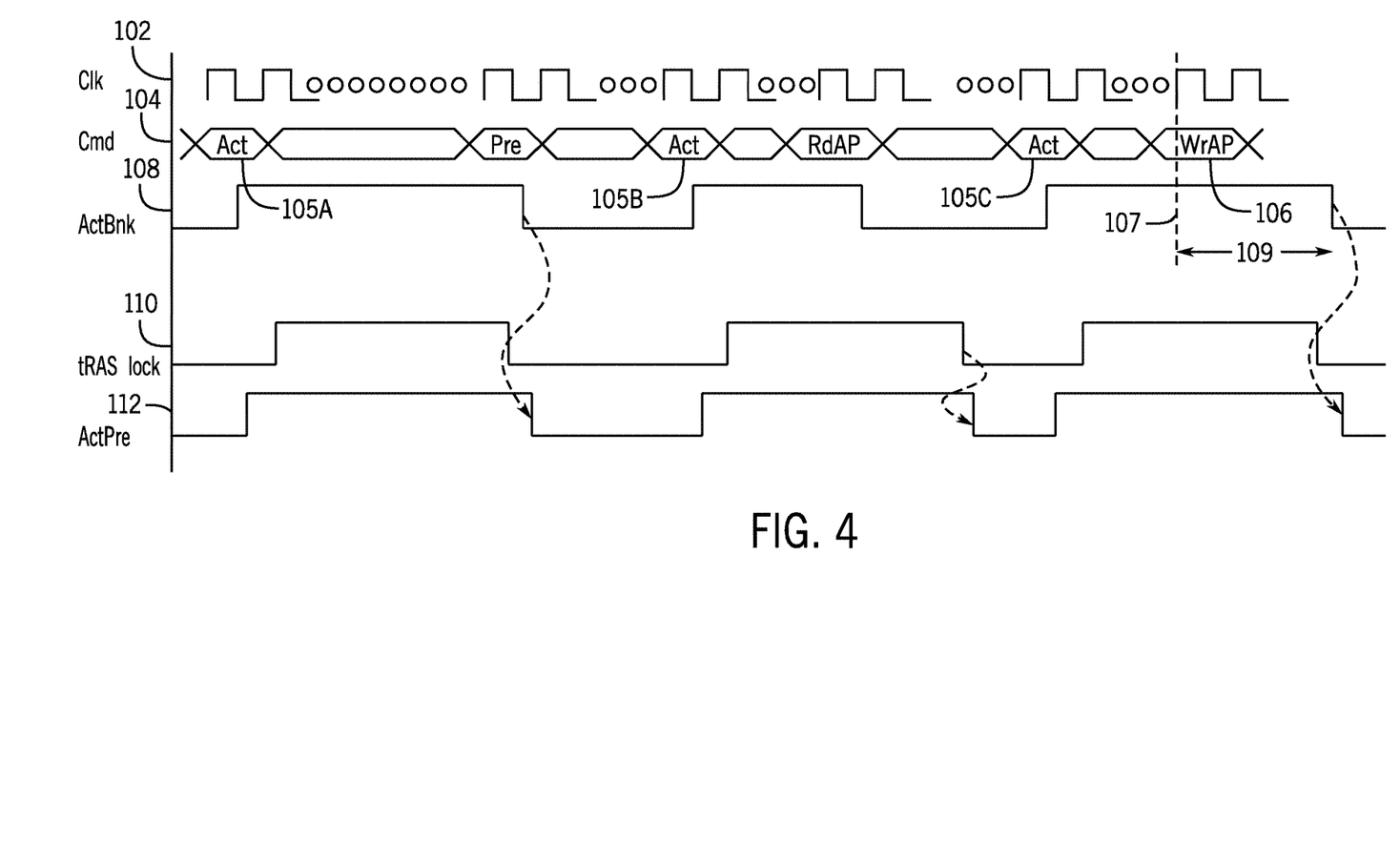
FIG. 4 is a timing diagram of the Wr-AutoP of FIG. 3, according to an embodiment of the present disclosure.

FIG. 4 is a timing diagram 100 for the Wr-AutoP process 70 of FIG. 3. As illustrated, the timing diagram 100 includes a line 102 that corresponds to a clock of the memory device 10. For instance, the line 102 may correspond to the Clk_t/Clk_c of FIG. 1, the ClkW 72 of FIG. 3, or the ClkG 52 of FIGS. 2 & 3. The timing diagram 100 also includes a line 104 corresponding to incoming commands. For instance, the received commands include a number of bits received at the command interface 14 and decoded in the command decoder 32. The illustrated commands include activate commands 105A, 105B, and 105C. The commands also include a precharge (Pre) command, a read auto-precharge (RdAP) command, and a Wr-AutoP command 106. The Wr-AutoP command 106 is latched at time 107.

The timing diagram 100 also includes a line 108 that corresponds to bank activate signals indicating that a row of memory cells/banks are to be activated. For instance, after an activate command, a memory bank 12 (e.g., memory bank 12A) is activated until a corresponding precharge occurs. For instance, when the activate command 105A is received, the bank activate signal remains asserted until the precharge command. Similarly, when the activate command 105B is received, the bank activate signal remains asserted until the RdAp command is received. Likewise, when the activate command 105C is received, the bank activate signal is asserted. However, unlike the precharge command and the RdAP command, the memory device 10 delays deassertion for the bank activate signal for a period of time 109. This delay corresponds to the shift in the Wr-AutoP shifter 80 to add the tWR number of clocks based on the set mode register value for the memory device 10.

The timing diagram 100 also includes a line 110 that corresponds to activation and deactivation of a tRAS lockout and a line 112 that indicates activation and precharge after a corresponding activate and/or bank activate signal.

Figure 5:
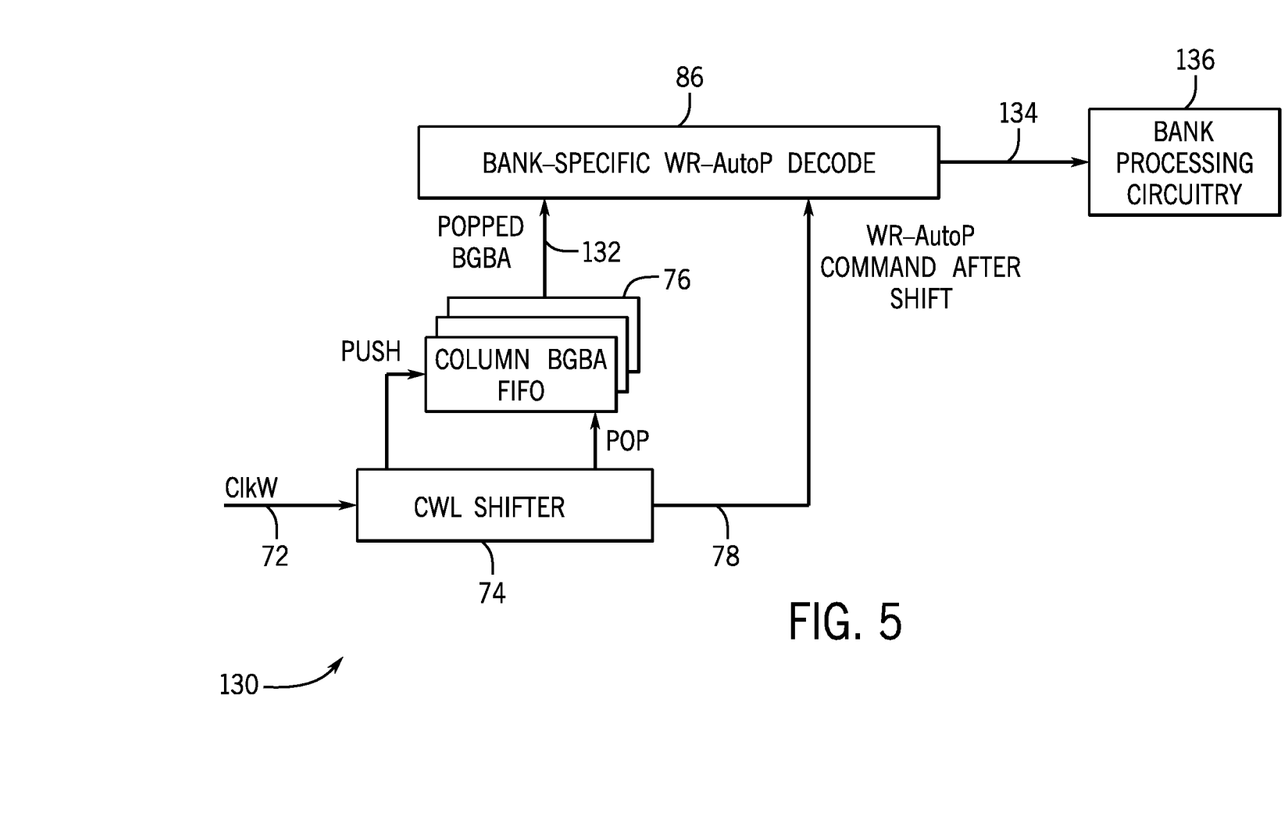
FIG. 5 is a block diagram of a Wr-AutoP using bank controls without a dedicated pre-charge clock propagated between the memory banks of FIG. 2, according to an embodiment of the present disclosure.

FIG. 5 illustrates a Wr-AutoP process 130 without using the back-and-forth transmissions illustrated in FIG. 2 and without generating and retransmitting the ClkG 52. As illustrated, the Wr-AutoP process 130 also may omit the Wr-AutoP shifter 80 that utilizes the ClkG 52. As illustrated, the Wr-AutoP process 130 receives the ClkW 72 at the CWL shifter 74 and utilizes the BGBA FIFO 76 as previously discussed in relation to FIG. 3. However, in the Wr-AutoP process 130, the shifted command 78 is transmitted to the bank-specific Wr-AutoP Decode 86 without applying additional shifts (e.g., tWR in the Wr-AutoP shifter 80). The bank-specific Wr-AutoP Decode 86 also receives a popped BGBA 132 from the BGBA FIFO 76 when the popped BGBA 132 is popped from the CWL shifter 74. The bank-specific Wr-AutoP Decode 86 transmits one or more signals 134 to bank processing circuitry 136 of a corresponding bank 12.

Figure 6:
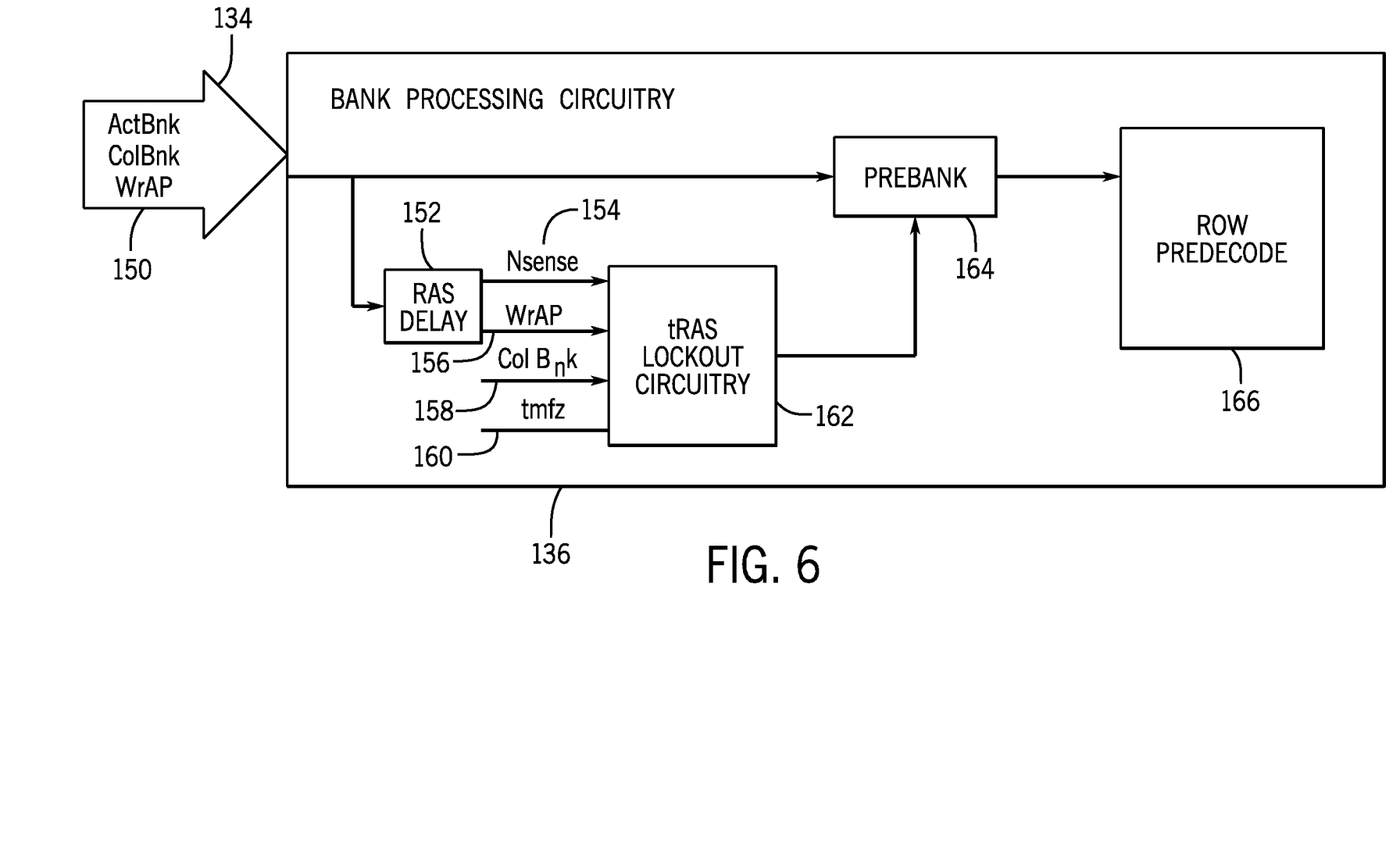
FIG. 6 is a block diagram of the bank control of FIG. 5, according to an embodiment of the present disclosure.

FIG. 6 is a block diagram of the bank processing circuitry 136. As illustrated, the one or more signals 134 includes the bank activation signal, a column bank activation signal indicating a column of cells/banks to activate a specific cell/bank at an intersection of an indicated column and row of the cells/banks, and a Wr-AutoP (WrAP) signal 150. The WrAP signal 150 indicates whether a Wr-AutoP process is to be performed in the respective memory bank 12 having the respective bank processing circuitry 136 receiving the WrAP signal 150.

The bank processing circuitry 136 includes rasdelay circuitry 152. After receiving an activation, the rasdelay circuitry 152 delays activation and waits on data from a differential signal in the memory array. The rasdelay circuitry 152 outputs a memory value (Nsense) 154 and the WrAP signal 156. Along with the Nsense 154 and the WrAP signal 156 transmitted from the rasdelay circuitry 152, a tRAS lockout circuitry 162 receives a column bank activation signal 158 and a test fuse signal 160. For instance, the WrAP signal 156 may be a global signal that does not have specific bank information. Instead, the column bank activation signal 158 may be ANDed with the WrAP signal 156 to identify the corresponding memory bank 12. The test fuse signal may be used to add an additional delay (e.g., 1-2 ns) and/or utilize a test mode to tweak/fine tune the delay added using the tRAS lockout circuitry 162 in addition to a set duration using a mode register.

The tRAS lockout circuitry 162 may include any method of adding an amount of delay. For example, the tRAS lockout circuitry 162 may include counters, latches, delays, and/or other circuitry. The amount of delay may be specific to an implementation of the memory bank 12. For example, in some embodiments, the memory device 10 may include an amount (e.g., 35-36 ns) providing sufficient time to enable the memory device 10 to access the memory. The delay ensures that a precharge command lockout ensures that the row/column may be accessed before operations are performed. However, the tRAS lockout circuitry 162 may be used to add lockouts other than tRAS having the same or different durations than the tRAS duration. For instance, the tRAS lockout circuitry 162 may be used/re-used for the tWR lockout for Wr-AutoP operations. Specifically, the tRAS lockout circuitry 162 may reset a count, add a number of cycles to be added, add additional delay, and/or start a different counter/delay path based on receipt of the WrAP signal 156.

The bank processing circuitry 136 also includes a pre-Bank circuitry 164 that is used to receive one or more signals from the tRAS lockout circuitry 162 and/or to bypass the tRAS lockout circuitry 162. For instance, the preBank circuitry 164 may include a multiplexer to multiplex the one or more signals 134 from the bank-specific Wr-AutoP Decode 86 and the one or more signals from the tRAS lockout circuitry 162. The preBank circuitry 164 transmits commands and related signals to row predecode circuitry 166 configured to decode for particular rows within the memory bank 12.

Figure 7:
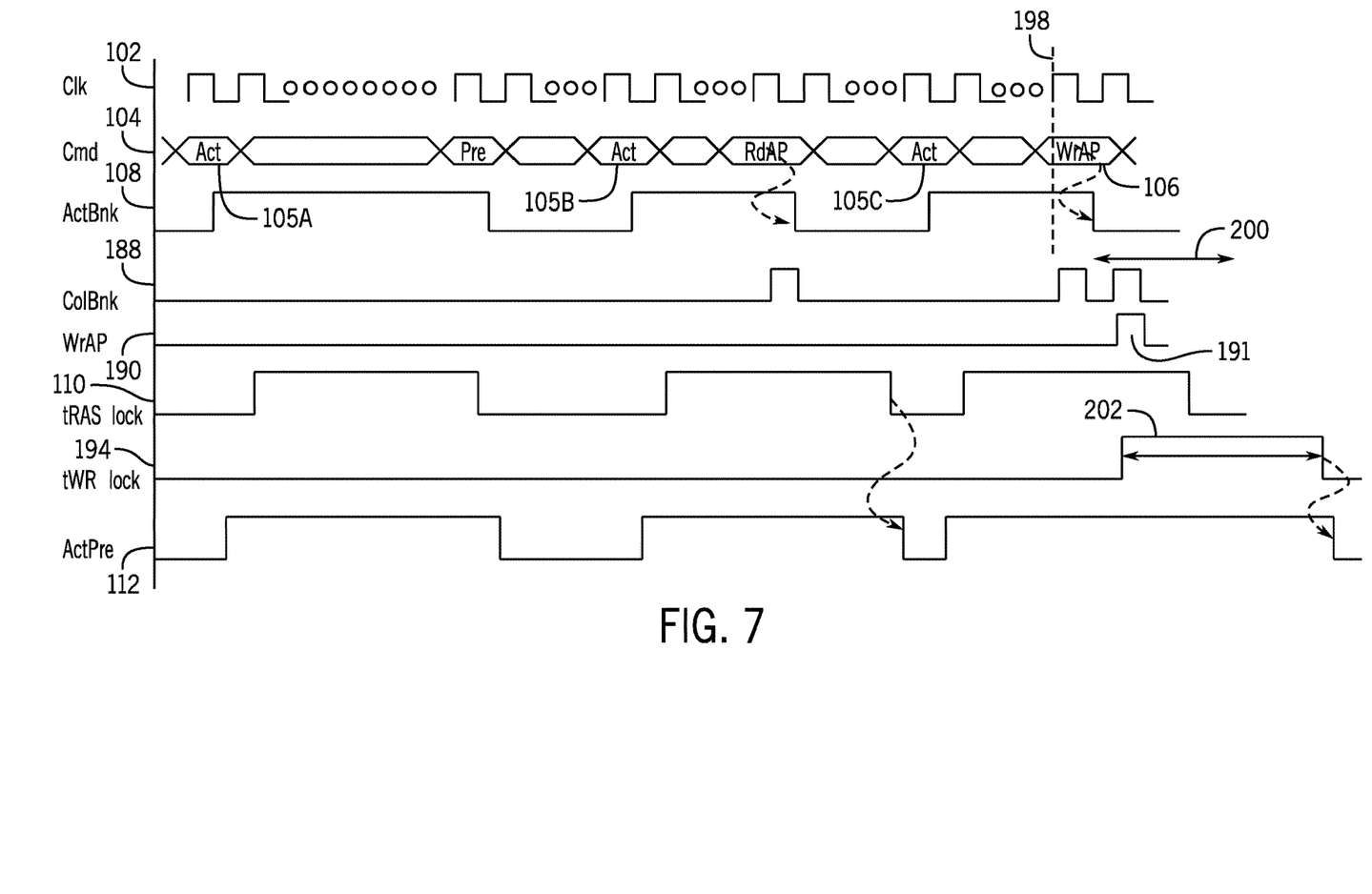
FIG. 7 is a timing diagram using the bank control of FIG. 5 having separate row address strobe time (tRAS) and write recovery time (tWR) lockout signals, according to an embodiment of the present disclosure.

FIG. 7 is a timing diagram 180 for the Wr-AutoP process implemented using the bank processing circuitry 162 of FIG. 6. As illustrated, the timing diagram 180 includes the line 102 corresponding to the ClkW 72. The timing diagram 180 also includes the line 104 corresponding to the commands 105 and 106. Additionally, the timing diagram 180 includes the lines 108, 110, and 112 respectively corresponding to a bank activation signal, the tRAS lockout, and a precharge activation. The timing diagram 180 also includes a line 188 corresponding to the column bank activation signal 158. The timing diagram 180 further includes a line 190 that corresponds to the WrAP signal 156 and a line 194 that corresponds to a tWR lockout. As illustrated, at time 198, the Wr-AutoP command 106 is received causing the WrAP signal 156 to be asserted as indicated by pulse 191. The assertion of the WrAP signal 156 causes the tWR lockout to be asserted.

Figure 8:
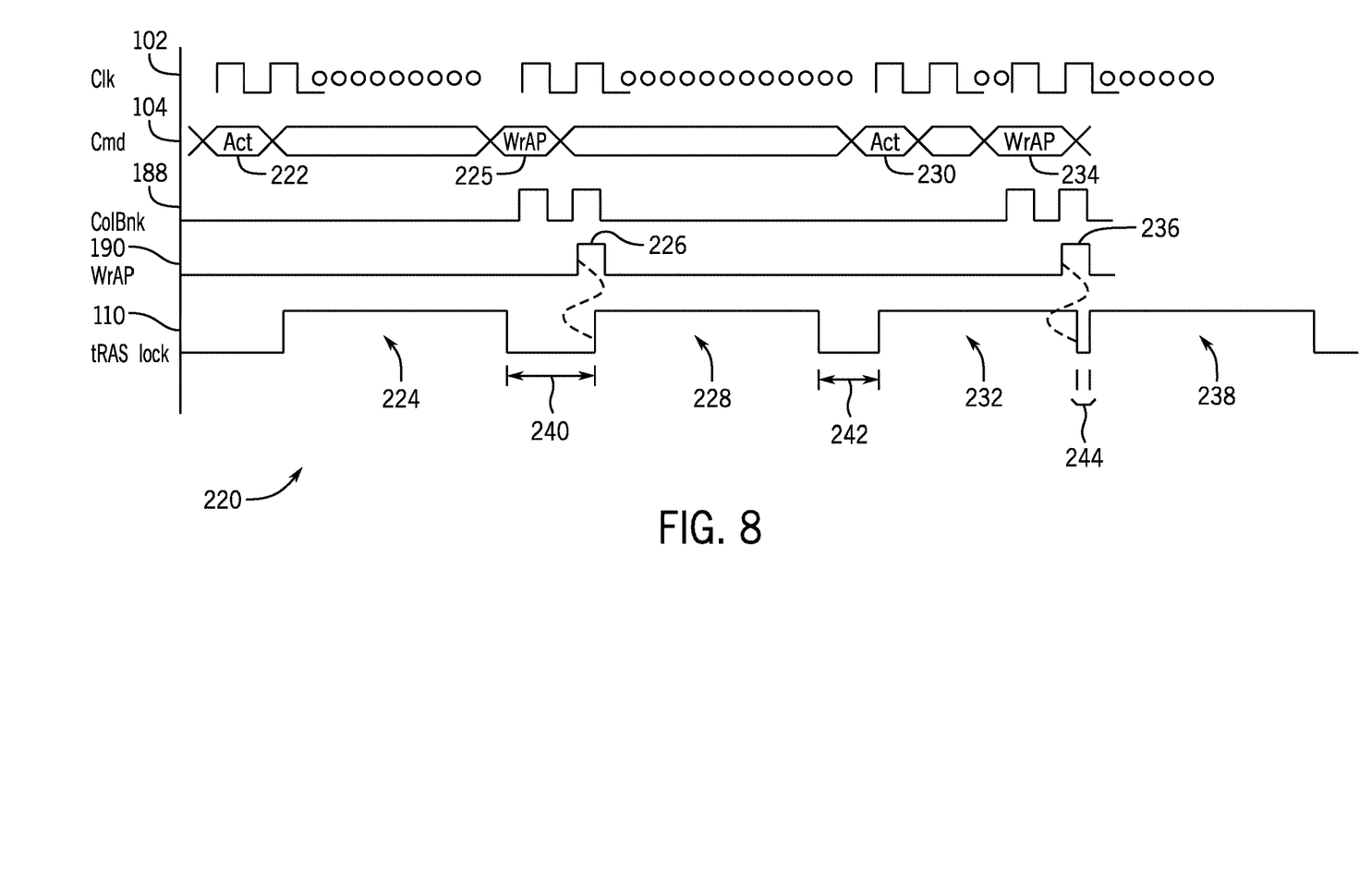
FIG. 8 is a block diagram of the bank control of FIG. 5 reusing the tRAS lock for the tWR lock, according to an embodiment of the present disclosure.

As noted, a de-assertion of the row bank activation signal in the command 105C may be transmitted without performing a tWR shift 200. Instead, a tWR lockout may be asserted using an assertion 202 of the tWR lockout indicated by the line 194 in the respective bank processing circuitry 136. In some embodiments, the tRAS lockout and the tWR lockout may be asserted using separate signals. Alternatively, a single lockout signal may be used to apply the tRAS lockout and the tWR lockout merely reflecting a single lockout indicator that applies to tRAS or tWR lockouts. FIG. 8 illustrates a timing diagram 220 that utilizes a single signal to indicate lockouts for both tRAS and tWR. As illustrated, the timing diagram 220 includes the lines 102, 104, 188, 190, and 110. However, the line 110 may be used to indicate either a lockout for tWR and tRAS purposes. As indicated, when an activate command 222 is received, a tRAS lockout 224 is asserted as indicated by the line 110. When a Wr-AutoP command 225 is received, the line 188 corresponding to the column bank activation signal 158 begins toggling and causes the WrAP signal 156 to have a pulse 226 asserted. In response to the pulse 226 of the WrAP signal 156, a tWR lockout 228 may be asserted as indicated by the line 110. Similarly, when an activate command 230 is received, a tRAS lockout 232 is asserted as indicated by the line 110. When a Wr-AutoP command 234 is received, the column bank activation signal 158 begins toggling and causes the WrAP signal 156 to have a pulse 236 asserted. In response to the pulse 236 of the WrAP signal 156, a tWR lockout 238 may be asserted as indicated by the line 110. As illustrated, a duration of gaps 240, 242, and 244 between the tWR and tRAS lockouts may vary depending on the locations of the assertions of respective activate commands 222, 230 and the respective Wr-AutoP commands 225, 234.

As shown above, the Wr-AutoP process 130 of FIG. 6 may be performed without the Wr-AutoP shifter 80 of FIG. 3. In other words, the Wr-AutoP process 130 may eliminate one clock limiter circuit thereby simplifying the circuitry used to implement and reducing the transmission of additional clocks (e.g., ClkG 52). Specifically, the wake up of the eliminated clock used in FIG. 3 may consume more energy transmitting the ClkG 52 to multiple die and may also reduce an amount of two-way path communications to perform the wake up operation. Additionally, removing the Wr-AutoP shifter 80 and the Wr-AutoP BGBA FIFO 82 may save additional area in the memory device 10. Furthermore, reusing the tRAS lockout for tWR lockouts may enable implementation of the Wr-AutoP process 130 without implementing additional and/or excess circuitry in the bank-specific Wr-AutoP Decode 86 or bank processing circuitry 136.

Although the foregoing discusses various logic-low and/or logic-high assertion polarities, at least some of these polarities may be inverted in some embodiments. While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device comprising:
a command interface configured to receive a write with an automatic precharge command;
a bank-specific decoder configured to decode the write with an automatic precharge command for a memory bank and to output a write auto-precharge (WrAP) signal; and
bank processing circuitry that comprises lockout circuitry, wherein the bank processing circuitry is configured to receive the WrAP signal and to apply a write recovery time (tWR) lockout after receipt of the WrAP signal and based at least in part on the WrAP signal indicating receipt of the write with an automatic precharge command.

2. The semiconductor device of claim 1, wherein the lockout circuitry is also configured to apply a row address strobe time (tRAS) lockout after an activate command.

3. The semiconductor device of claim 2, wherein the lockout circuitry comprises a counter configured to count out the tWR lockout and the tRAS lockout.

4. The semiconductor device of claim 2, wherein the lockout circuitry comprises delay circuitry configured to add a first duration of delay for the tWR lockout and a second duration of delay for the tRAS lockout.

5. The semiconductor device of claim 2, wherein a duration of the tWR lockout is set to a number of clock cycles using a mode register for the semiconductor device.

6. The semiconductor device of claim 5, wherein the lockout circuitry is configured to receive a fine tuning signal to adjust the duration of the tWR lockout in addition to the setting of the duration via the mode register.

7. The semiconductor device of claim 1, comprising a column address strobe (cas) write latency (CWL) shifter configured to add a duration comprising the CWL to the write with an automatic precharge command prior to decoding in the bank-specific decoder.

8. The semiconductor device of claim 7, comprising a bank-group bank-address (BGBA) FIFO that is configured to push a bank address when the write with an automatic precharge command enters the CWL shifter.

9. The semiconductor device of claim 8, wherein the BGBA FIFO is configured to pop the bank address when the write with an automatic precharge command reaches an end of the CWL shifter.

10. The semiconductor device of claim 9, wherein the BGBA FIFO is configured to transmit the bank address to the bank-specific decoder when the bank address is pushed from the BGBA FIFO.

11. The semiconductor device of claim 10, wherein the bank-specific decoder is configured to transmit a row address signal and a column bank address signal to the bank processing circuitry along with the WrAP signal.

12. The semiconductor device of claim 1, comprising a plurality of memory banks each having a bank-specific decoder and bank processing circuitry.

13. The semiconductor device of claim 12, comprising a plurality of BGBA FIFOs corresponding to the plurality of memory banks.

14. A method, comprising:
receiving, at a command interface of a memory device, a write auto-precharge (Wr-AutoP) command;
transmitting the Wr-AutoP command to a decoder;
decoding the Wr-AutoP command in the decoder;
in the decoder, generating and transmitting a Wr-AutoP signal to bank processing circuitry in a memory bank targeted for the Wr-AutoP command; and
in response to receiving the Wr-AutoP signal at the bank processing circuitry, applying a write recovery time (tWR) lockout after receipt of the Wr-AutoP signal for the memory bank based at least in part on the Wr-AutoP signal.

15. The method of claim 14, comprising adding a column address strobe (cas) write latency (CWL) shift to the Wr-AutoP command using a CWL shifter prior to transmitting the Wr-AutoP command to the decoder.

16. The method of claim 15, comprising:
pushing a corresponding bank address that corresponds to the Wr-AutoP command to a bank-group, bank-address (BGBA) FIFO when the Wr-AutoP command enters the CWL shifter; and
popping the corresponding bank address from the BGBA FIFO when the Wr-AutoP command reaches an end of the CWL shifter.

17. The method of claim 14, comprising determining a number of clock cycles to apply the lockout based at least in part on a memory recovery time (tWR) duration set in a mode register of the memory device.

18. The method of claim 17, wherein applying the lockout comprises reusing row address strobe time (tRAS) lockout circuitry in the bank processing circuitry based at least in part on the Wr-AutoP signal, wherein the tRAS lockout circuitry is configured to apply a tRAS lockout after receiving an activate command and a tWR lockout after receiving the Wr-AutoP signal.

19. A memory device, comprising:
a command interface configured to receive a write auto-precharge command from a host device; and
a plurality of memory banks, each memory bank comprising:
a bank-specific decoder configured to generate a write auto-precharge signal (WrAP signal) in response to decoding a write auto-precharge command targeting the respective memory bank; and
bank processing circuitry configured to receive the WrAP signal and to reuse row address strobe time (tRAS) lockout circuitry to apply a write recovery time (tWR) lockout in response to receiving the WrAP signal.

20. The memory device of claim 19, wherein a duration of the tWR lockout is set using a mode register of the memory device, and the tRAS lockout circuitry comprises a counter configured to count out the tRAS lockout in response to an activate command and to count out the tWR lockout in response to the WrAP signal.

21. The memory device of claim 19, wherein a duration of the tWR lockout is set using a mode register of the memory device, and the tRAS lockout circuitry comprises delay circuitry configured to delay by the tRAS lockout in response to an activate command and to delay by the tWR lockout in response to the WrAP signal.

* * * * *